United States Patent
Guillot et al.

(10) Patent No.: US 8,040,643 B2
(45) Date of Patent: Oct. 18, 2011

(54) POWER SUPPLY SWITCHING APPARATUS WITH SEVERE OVERLOAD DETECTION

(75) Inventors: Laurent Guillot, Seysses (FR); Pierre Turpin, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 115 days.

(21) Appl. No.: 12/518,929

(22) PCT Filed: Dec. 22, 2006

(86) PCT No.: PCT/EP2006/070179
§ 371 (c)(1),
(2), (4) Date: Jun. 12, 2009

(87) PCT Pub. No.: WO2008/077439
PCT Pub. Date: Jul. 3, 2008

(65) Prior Publication Data
US 2010/0020450 A1   Jan. 28, 2010

(51) Int. Cl.
*H02H 9/08* (2006.01)
(52) U.S. Cl. .................. 361/23; 361/93.9
(58) Field of Classification Search .......... 361/23, 361/93.7–93.9
See application file for complete search history.

(56) References Cited

U.S. PATENT DOCUMENTS

| | | | |
|---|---|---|---|
| 4,914,542 A | 4/1990 | Wagoner | |
| 5,723,915 A | 3/1998 | Maher et al. | |
| 5,926,010 A * | 7/1999 | Hosokawa et al. | 323/222 |
| 7,154,250 B2 * | 12/2006 | Vinciarelli | 323/240 |
| 7,848,071 B2 * | 12/2010 | Takahashi et al. | 361/93.1 |
| 2003/0142449 A1 * | 7/2003 | Iwata et al. | 361/58 |
| 2004/0008463 A1 | 1/2004 | Brennan et al. | |

FOREIGN PATENT DOCUMENTS

| | | |
|---|---|---|
| DE | 4320112 A1 | 12/1994 |
| DE | 19705339 A1 | 8/1998 |
| DE | 102005014167 A1 | 10/2006 |
| EP | 0483744 A | 5/1992 |
| EP | 0493238 A1 | 7/1992 |
| EP | 0945950 A2 | 9/1999 |
| WO | 0079681 A | 12/2000 |
| WO | 2006034730 A | 4/2006 |
| WO | 2006056232 A | 6/2006 |
| WO | 2006111187 A1 | 10/2006 |
| WO | 2006111188 A1 | 10/2006 |
| WO | 2008077439 A1 | 7/2008 |

* cited by examiner

*Primary Examiner* — Danny Nguyen (57) ABSTRACT

Power supply switching apparatus comprising an output switch for supplying power from a power supply to a load connected to an output terminal, a driver for controlling turn-on of said output switch, and a control signal generator for controlling said driver to produce a desired progressive turn-on characteristic. The apparatus also includes overload detection means responsive to a parameter of the load relative to a reference signal to provide a fault signal in case of detection of an overload condition after a turn-on phase of said output switch. The control signal generator is responsive to the reference signal to activate said overload detection means to provide a fault signal during the turn-on phase of the output switch even in presence of a severe overload condition at the output terminal.

20 Claims, 6 Drawing Sheets

POWER SUPPLY SWITCHING APPARATUS WITH SEVERE OVERLOAD DETECTION

FIELD OF THE INVENTION

This invention relates to power supply switching apparatus with overload detection and more particularly with capability for detecting severe overload even during a turn-on phase.

BACKGROUND OF THE INVENTION

Power supply switching apparatus with overload detection, also referred to as a 'smart power switch', is used in many applications, including automotive equipment, especially to control vehicle lighting, for example. It is particularly important to protect automotive wire harness and printed circuit boards (PCB) during the turn-on of the power supply, as well as switch components of the power supply itself, even in the event of severe short-circuits. The overload detector responds to an overload by providing a fault signal that can be used to limit or avoid damage. The present invention is particularly, but not exclusively, usable in such applications. Power switches with overload detection are disclosed in Patent Applications PCT/EP2004/014895, PCT/EP2005/005208, PCT/EP2005/005211 and PCT/EP2005/005212.

Such smart power switches are subject to stringent power consumption limits during their quiescent operational mode and it is desirable to avoid powering and activating overload detection before the load is to be turned on. Conveniently, the overload detector or sensor is powered and activated by the same control signal as turns on the load. Certain conventional overload protection circuits use a sensor comprising a sense resistor or Field Effect Transistor ('FET') and have a significant settling time of a few hundred microseconds (μsecs) when they are turned on; this already poses some issues for timely protection and prolongation of the reaction time should be minimised.

Moreover, power supply apparatus of this kind may be arranged to provide a progressive build-up of output current during turn-on, known as round-shaping, which is implemented to meet Electro-Magnetic Compatibility ('EMC') requirements, notably to reduce radio frequency emissions. In order to achieve EMC requirements, the output slew-rate, that is to say the progressive turn-on of the output switch of the power supply, is conveniently made dependent on the output voltage (Vout), which enables the use of a passive filter component to be avoided, for example. The round-shaping can be achieved by sensing the output voltage to obtain a progressive variation of the control signal applied to the output switch, turning the output switch on progressively. However, this progressive turn-on also tends to prolong the overload detection reaction time.

The overload detector responds to the load impedance by providing a fault signal that can be used to limit or avoid damage. Overload detectors exist that function well to detect typical resistive overloads, that is to say where the load impedance still presents a significant resistance even if it is an order of magnitude less than the normal load, for example, at least after an acceptable initial time delay while the energisation of the detector itself builds up. However, in severe overload conditions, known overload detectors may not respond adequately to a severe short-circuit condition at the power supply output. For example, if the overload detector is responsive to Vout, a severe short-circuit at the load will pull Vout down and keep it relatively low during a prolonged turn-on time in spite of rapidly increasing power supply output current. The overload sensor will not be energised to detect an abnormal condition during the turn-on phase fast enough to prevent the power dissipation damaging the power supply output switch and/or also the load supplied with power (wire harness and/or PCB).

A need exists for power supply apparatus with rapid overload detection during the turn-on phase, especially against severe overload conditions.

SUMMARY OF THE INVENTION

The present invention provides a power supply switching apparatus as described in the accompanying claims.

DETAILED DESCRIPTION OF THE PREFERRED EMBODIMENTS

Figure 1:
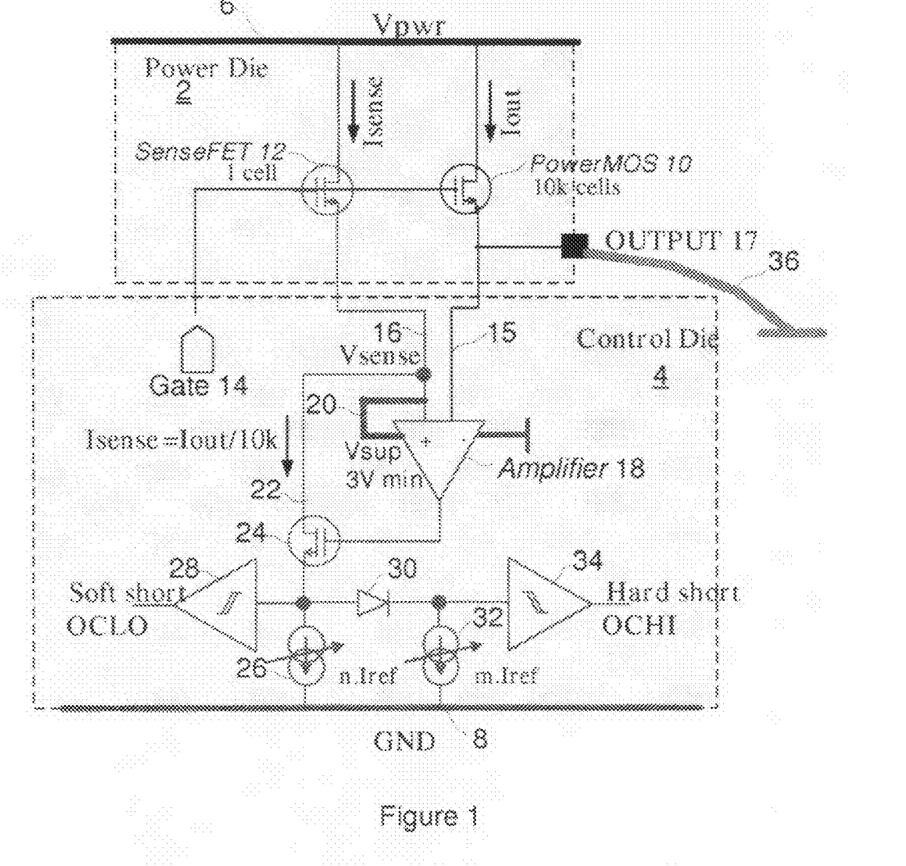
FIG. 1 is a schematic circuit diagram of over-current protection in a power supply switching apparatus in accordance with one embodiment of the invention, given by way of example.

FIG. 1 shows the overall architecture of power switching control and over-current protection in a power supply switching apparatus both in accordance with one embodiment of the invention and in a known power supply switching apparatus. The switching apparatus shown is suitable for switching incandescent light bulbs in an automotive application with nominal battery supply voltage of 12 volts although the apparatus can also have other applications and is applicable at other battery voltages.

The apparatus includes two semiconductor dies, a power die 2 and a control die 4. The dies are supplied with power between a positive power rail 6 and ground 8. It is possible alternatively to integrate the power supply and control functions on a single die.

The power die 2 comprises an array of field effect transistor ('FET') power cells 10 of metal-oxide-Silicon ('MOS') technology connected for switching and conducting the current Iout to be switched and a physically similar sense FET cell 12 connected for conducting a sense current Isense. The FETs 10 and 12 have gates connected together to receive a gate signal on a line 14 from the control die. The FETs 10 and 12 have drains connected to the power rail 6 and sources connected to supply current to the control die 4 over lines 15 and 16. The signal applied to the gates serves to switch the FETs 10 and 12 on and off and also to control their resistance during the switching on phase. Switching on the array of FETs 10 applies the battery voltage of the power line 6 to an output terminal 17 connected to the line 15 and to which the load may be connected. The array of FETs 10 contains a sufficient number of FET cells, in one embodiment 10,000 cells, to carry the current required to supply the load, whereas a single cell is sufficient in this embodiment to carry the much smaller sense current in the line 16.

The control die 4 includes an amplifier 18 having differential inputs connected to the lines 15 and 16, the power supply for the amplifier being provided by a connection 20 to the line 16 of the sense FET 12, so that power is supplied to the amplifier only when the sense FET is conducting. The amplifier 18 is only operational for a voltage greater than 3 volts. The line 16 is also connected over a line 22 to the drain of a FET 24 whose source is connected through a constant current element 26 to ground 8. The connection between the FET 24 and the constant current element 26 is connected to a Schmidt trigger 28 that provides a fault signal OCLO indicative of a 'soft overload' condition in the event of a resistive overload condition of the load between the output terminal 17 and ground as shown at 36. The source of the FET 24 is also connected through a diode 30 and through a constant current element 32 to ground 8. The connection between the diode 30 and the constant current element 32 is also connected to a Schmidt trigger 34 that provides a fault signal OCHI indicative of a 'hard overload' condition in the event of a more severe overload condition of the load, since the threshold voltage of the diode prevents actuation of the Schmidt trigger 34 until the output of the amplifier 18 has reached a higher voltage. It will be appreciated that so-called constant current elements like 26 and 32 present a small impedance when the current supply applied is insufficient to reach the nominal constant current of the element and their impedance increases once the nominal current is reached, so as to maintain the current at the nominal level. In another embodiment of the present invention, the constant current elements 26 and 32 are replaced by resistors, which present constant impedance.

In one example of an application of the invention, the parameters defining the 'soft overload' condition are set to correspond to an abnormally low resistance of the load, which may be caused by the usage of a bulb of wrong current capacity in the lamp, for example, and the parameters defining the 'hard overload' condition are set to correspond to a short circuit at the lamp socket so that the load presented to the switch is virtually as low as the very low resistance of the cable connecting the socket to the switch, for example.

Figure 2:
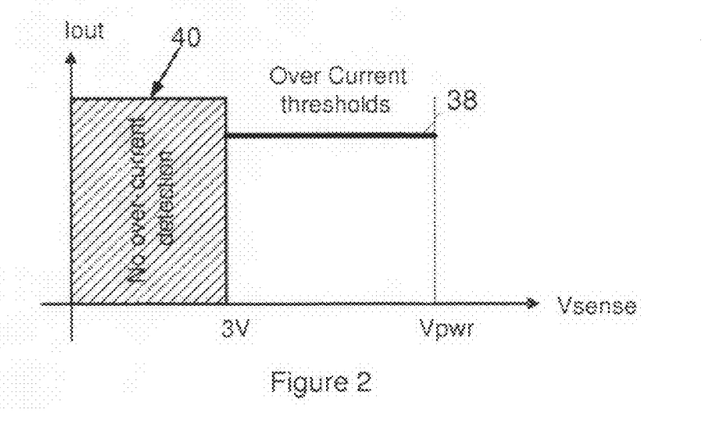
FIG. 2 is graph of current detection thresholds as a function of applied voltage in operation of the over-current protection of FIG. 1.

As illustrated in FIG. 2, the over-current protection shown in FIG. 1 is effective in operation to detect load current through the output terminal 17 exceeding a threshold value 38 when the voltage supplied by the lines 16 and 20 to the amplifier 18 exceeds 3 volts up to the maximum voltage Vpwr. As shown by the hatched area 40, the over-current protection is not effective when the voltage supply to the amplifier 18 is below 3 volts.

Figure 3:
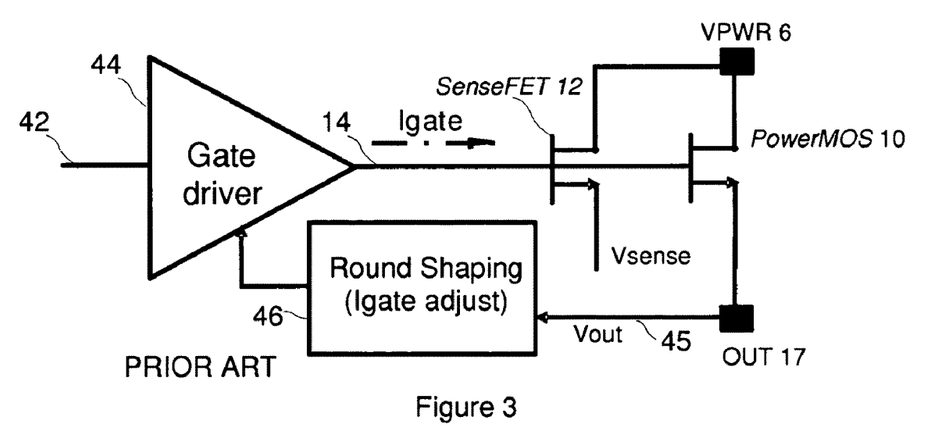
FIG. 3 is a schematic diagram of a round-shaping circuit in a known power supply switching apparatus.

In a known power supply switching apparatus having over-current protection of the kind shown in FIG. 1, the gate signal applied to the line 14 is generated by a circuit of the kind illustrated in FIG. 3. A binary switching command signal, generated in response to a manual or semi-automatic input by a command signal generator (not shown), and which may be a pulse-wave modulated signal if desired, is applied to an input 42 of a gate driver circuit 44 to generate the signal applied to the line 14. The voltage Vout at the output terminal 17 is applied over a line 45 to a round-shaping circuit 46, which adjusts the current Igate supplied by the gate driver 44, so as to obtain a smooth output slew-rate, that is to say a progressive turn-on of the power supply from the rail 6 through the output switch array 10, in dependence on the output voltage (Vout).

Figure 4:
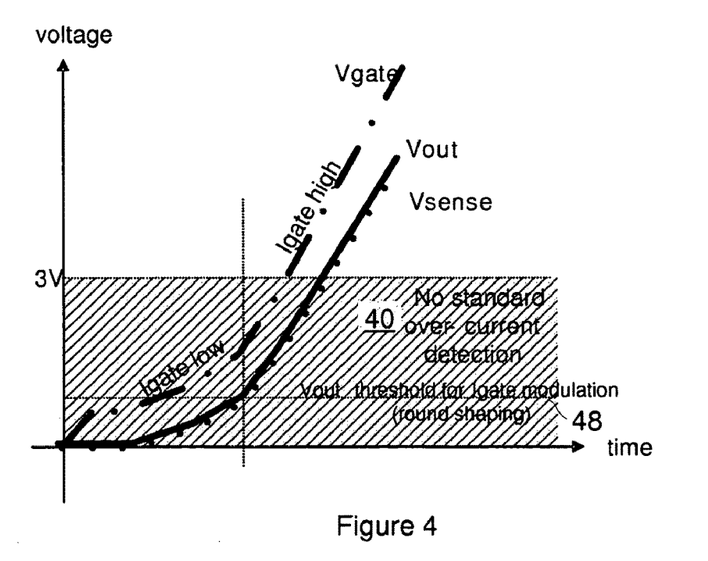
FIG. 4 is a graph of voltage as a function of time in the case of a normal load applied to the output of the power supply switching apparatus of FIG. 1 and FIG. 3.

In normal operation with no overload, the known power supply switching apparatus with the gate signal generator of FIG. 3 functions as shown in FIG. 4, which illustrates the variation of voltages in the apparatus as a function of time. Initially, as long as the switching command signal on line 42 is de-asserted, the voltage Vgate on the line 14 applied to the gates of the FETs 10 and 12 is low, as shown in chain-dotted lines, the FETs are switched off and Vout, shown in full lines, is zero, as is Vsense, shown in dotted lines. When the switching command signal on line 42 is asserted, Vgate starts to increase so as to reduce progressively the on-resistance of the FETs 10 and 12, increasing Vout (and Vsense) progressively in the presence of a normal load. However, as long as Vout is below a threshold value 48, the slew rate, that is to say the rate of increase in Vout, is kept low to reduce the switching electromagnetic emissions by limiting the gate current Igate in the line 14. In one example, Igate is divided by a factor of 4 for Vout<0.5V relative to its value for Vout>0.5V.

Figure 5:
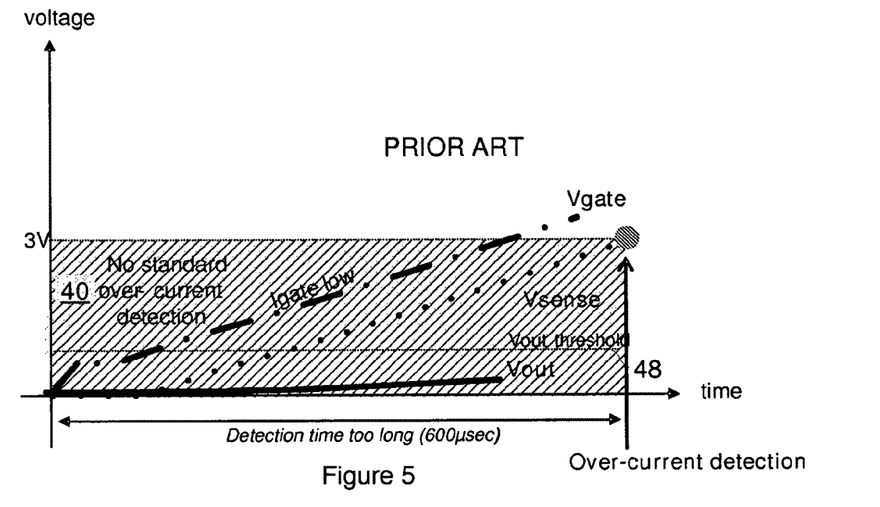
FIG. 5 is a graph of voltage as a function of time in the case of a severe overload applied to the output of the known power supply switching apparatus of FIG. 3.

Such a characteristic is satisfactory in the cases of a normal load and 'soft overload' or 'hard overload' conditions. However, a 'severe overload' condition such as may be caused by a short circuit at the output terminals of the switch itself can present an even lower impedance to the switch, without even the resistance of the cable connecting the switch to the lamp to limit the current drawn. In the case of a severe short-circuit to ground 36, as illustrated in FIG. 5, the voltage Vout at the output terminal 17 is pulled down close to ground (Vout=0), with the result that the current Igate in the line 14 supplying the gate of the powerMOS FET 10 stays at a reduced value under the control of the round-shaping circuit 46. Also the Gate-Source capacitance of the PowerMOS FET 10 has to be charged, since the source voltage of the FET 10 is held down close to ground, adding capacitance on the gate node 14. This leads to a gate voltage slew rate divided by factor of about 10, instead of a factor of about 4 in normal operation of the example quoted above, so that the circuit takes about 300 μsec to reach the situation where Vsense=3V and Vgate=5.5V. Energising the over-current detection of the apparatus shown in FIG. 1 from the current Isense that the senseFET 12 starts to supply needs sufficient voltage on the SenseFet 12 (~3.5V) & Gate (~5.5V) and hence on the amplifier 18 to be functional. So over-current detection is not functional during a Turn ON time of about 600 μsec as shown in FIG. 5. This reaction is not fast enough to prevent the power dissipation damaging the power supply output switch and/or also the load supplied with power which can reach 3 kW for example during the 600 μsec delay, which is capable of causing significant damage.

Figure 6:
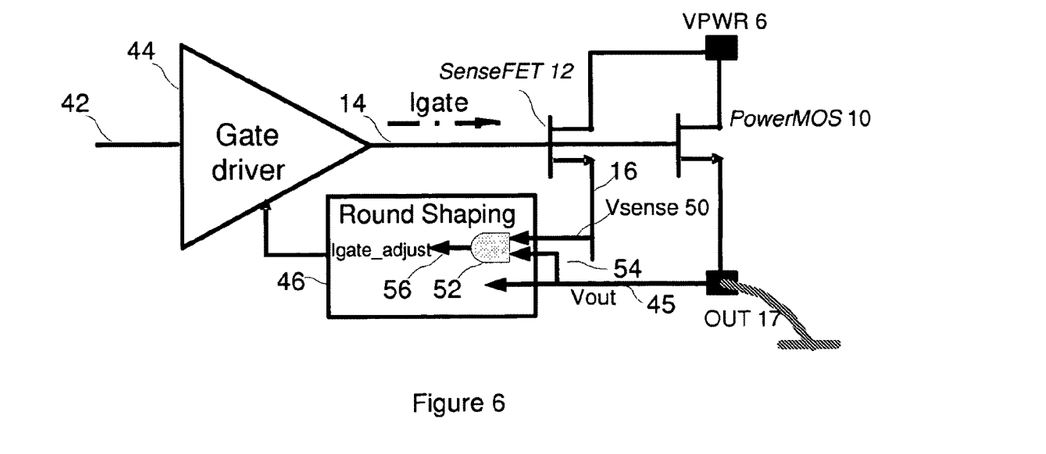
FIG. 6 is a schematic diagram of a round-shaping circuit and severe overload detector in a power supply switching apparatus as shown in FIG. 1 in accordance with an embodiment of the present invention.

In the embodiment of the present invention illustrated by FIG. 6, in the event of an overload to ground at the output terminal 17, the round-shaping circuit is responsive to the voltage Vsense on the line 16, applied to an input of the round-shaping circuit over a line 50, as well as to the output voltage Vout. The round-shaping circuit 46 includes an OR circuit 52 responsive to the relative values of the voltage Vsense on the line 16 applied over the line 50 and the output voltage Vout applied over a line 54.

Figure 7:
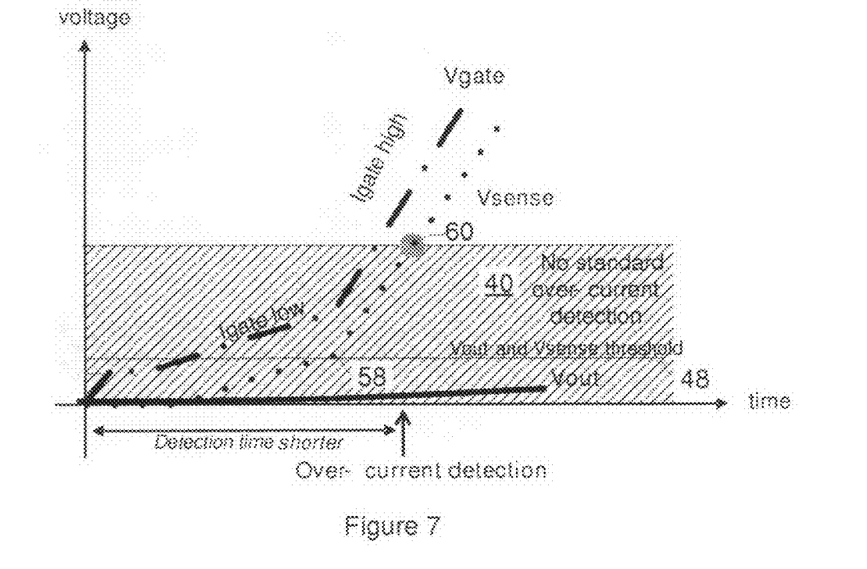
FIG. 7 is a graph of voltage as a function of time in the case of a severe overload applied to the output of the power supply switching apparatus of FIG. 6.

In operation, and referring also to FIG. 7, the OR circuit 52 provides a signal Igate_adjust to the gate driver 44 to accelerate the current Igate in the line 14 as soon as the voltage Vsense reaches the threshold voltage 48, at which the OR circuit 52 is operational, as shown at 58 in FIG. 7. The Schmidt trigger 34 then asserts the Hard overload signal OCHI once Vsense reaches the threshold of the zone 40 at which the amplifier 18 becomes operational, as shown at 60 in FIG. 7, even if the output voltage Vout is still lower than the threshold 48. This acceleration of the increase in the voltage Vsense in the line 16 shortens the time taken for the amplifier 18, FET 24 and Schmidt trigger 34 to become functional and generate a fault signal reporting the fault condition.

Figure 8:
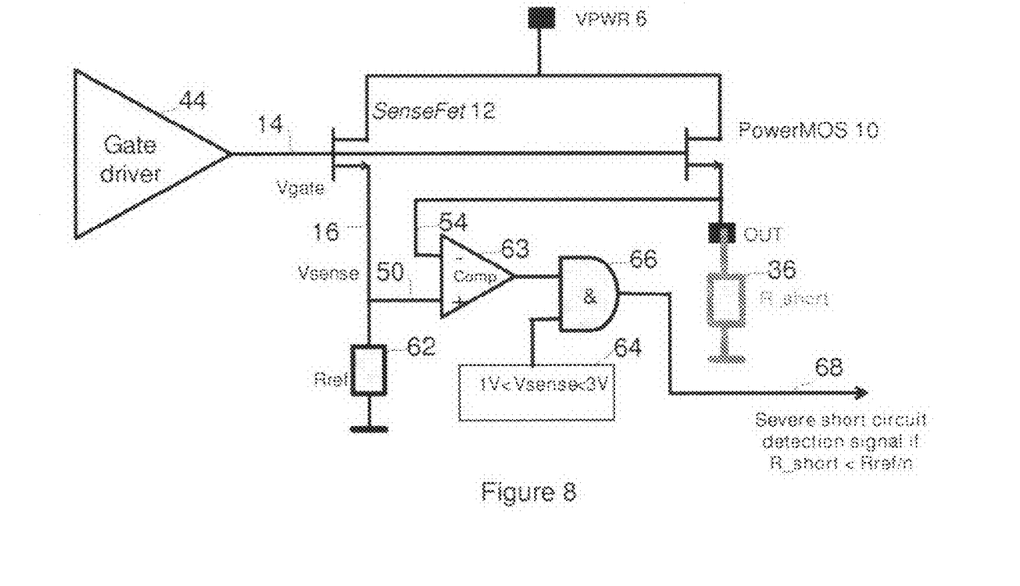
FIG. 8 is a schematic diagram of a severe overload detector in a power supply switching apparatus as shown in FIG. 1 in accordance with another embodiment of the present invention.
Figure 9:
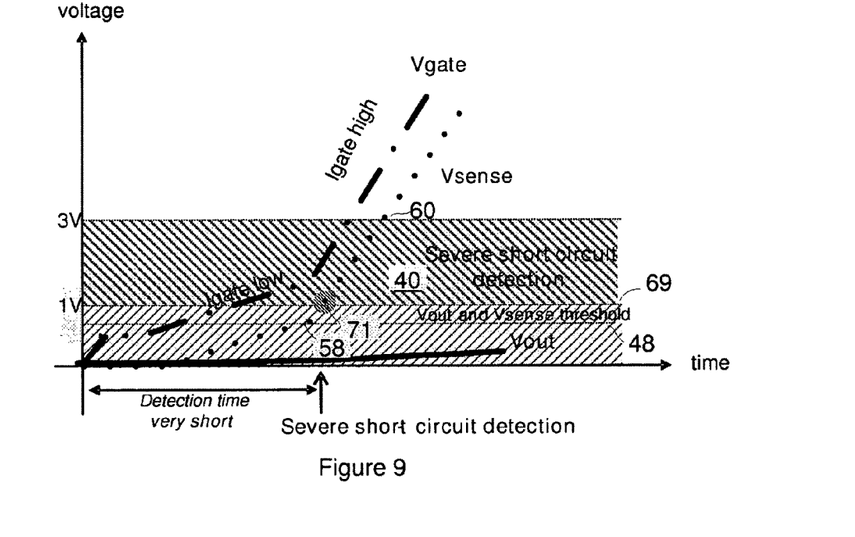
FIG. 9 is a graph of voltage as a function of time in the case of a severe overload applied to the output of the power supply switching apparatus of FIG. 8.

In the embodiment of the present invention illustrated by FIGS. 8 and 9, the round-shaping circuit is again responsive to the voltage Vsense on the line 16, applied to an input of the round-shaping circuit over a line 50, as well as to the output voltage Vout. In this embodiment, the constant current source 32 is replaced by a reference resistor 62. The sense voltage Vsense and the output voltage Vout are compared in a comparator 63 to give a comparison between the overload resistance R_short and the resistance Rref of the reference resistor 62 divided by 'n' where n is the ratio of the number of cells in the PowerMOS FET 10 to the number of cells in the sense FET 12. A threshold circuit 64 generates a threshold signal that is asserted if the value of Vsense lies between a lower threshold of detection 69 (1 volt in this example) at which the comparator 63 becomes operational and the threshold of the zone 40 where over-current detection becomes functional (3 volts in this example). The outputs of the threshold circuit 64 and of the comparator 63 are applied to an AND circuit 66 having a dedicated output 68 providing a severe short circuit fault signal which is asserted in the range where the value of Vsense is between the thresholds 69 and 40 if the output of comparator 63 is asserted.

As shown in the graph of voltage against time in FIG. 9, in the embodiment of the present invention shown in FIG. 8, a severe short circuit condition can be detected and signaled at a moment 71 when Vsense reaches the threshold 69, soon after the moment 58 when the sense voltage Vsense reaches the lower threshold 48 and the current Igate is increased, without needing to wait until the moment 60 when the sense voltage Vsense reaches the upper threshold of the zone 40 and the amplifier 18, FET 24 and Schmidt trigger 34 become operational. Severe short circuits can be detected in an example of this embodiment of the invention during the period 40 while over-current detection is still not functional within a time of about 100 μsec from application of the gate signal on the line 14. This reaction time is fast enough to prevent the power dissipation damaging the power supply output switch or the load supplied with power and can limit the peak output power to 500 W for example even in presence of a severe short circuit.

Figure 10:
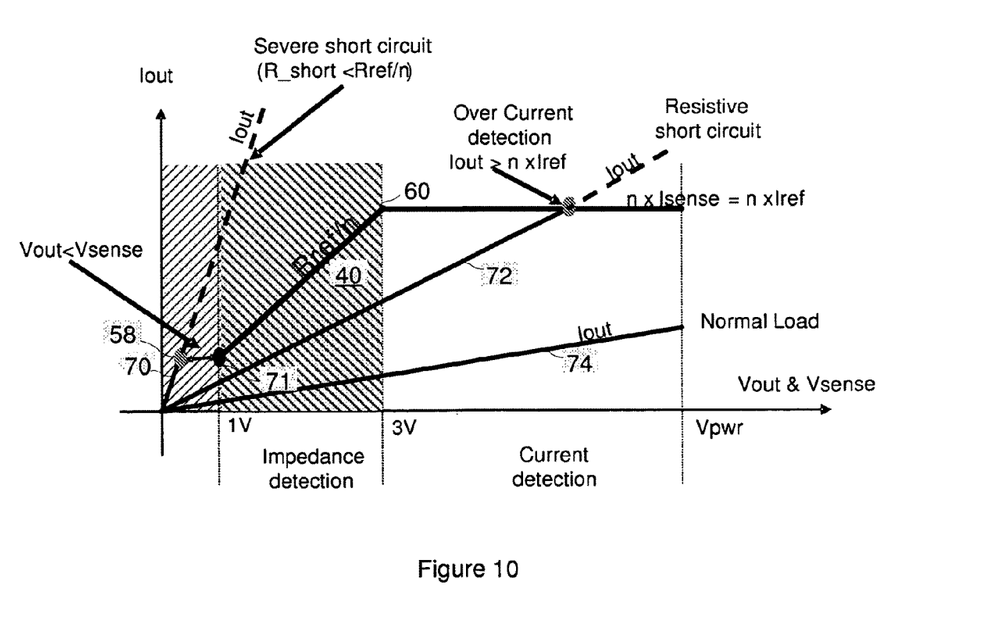
FIG. 10 is graph of currents and thresholds as a function of applied voltage in operation of the severe overload and over-current protection of FIG. 8.

The operation of the apparatus of FIG. 8 is shown for various operating conditions in the graph of current against voltage of FIG. 10. The line 70 in FIG. 10 represents the output current Iout in case of a severe short circuit at the output terminal 17. As shown in dotted lines, in the absence of protection in the zone 40, the output current would rapidly run away and cause damage but the condition can be detected at moment 71 by the comparator 63 and the AND circuit 66 A less severe overload will be detected if the comparator 63 and the AND circuit 66 signal a fault condition later while the value of Vsense is between the thresholds 48 and 40, between moments 71 and 60.

After the moment 60, when the amplifier 18 and Scmidt triggers 28 and 34 become operational, a resistive overload at the output terminal 17 will be detected by the over-current protection shown in FIG. 1, as shown by the line 72 in FIG. 10. Although the time taken to signal the fault condition is longer than for the case of severe short circuit detection, the output current involved is lower and less prone to cause damage. The line 74 illustrates the case of a normal load at the output terminal 17.

Figure 11:
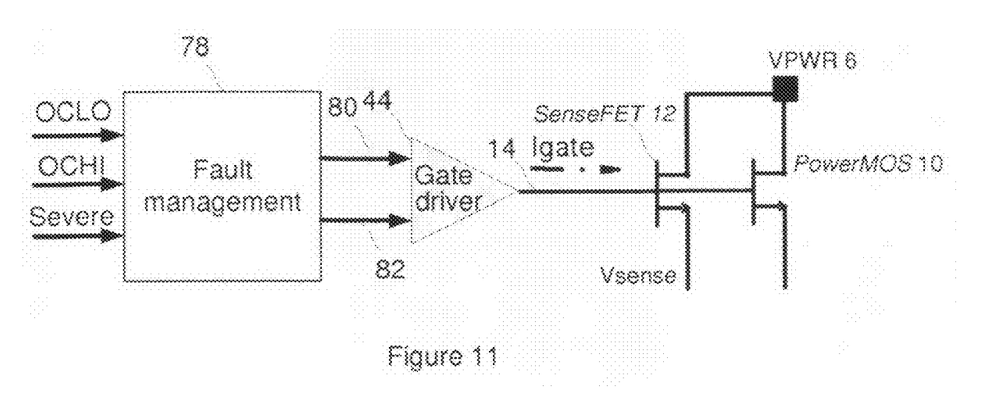
FIG. 11 is a block schematic diagram of fault management circuit in a power supply switching apparatus in accordance with an embodiment of the invention.

The fault signals may used in various ways by protection functions to limit the output current Iout in fault conditions and prevent damage. FIG. 11 shows schematically a protection apparatus in one example of an embodiment of the invention. In the protection apparatus of FIG. 1, the signals OCLO and OCHI from the Schmidt triggers 28 and 34 and the severe overload signal from the output 68 of the AND circuit 66 are applied to respective inputs of a fault management circuit 78. The outputs of the fault management circuit 78 control the gate driver 44 in case of assertion of a fault signal. The occurrence of a soft overload signal OCLO asserts a signal on a line 80 to trigger a normal turn off of the power switch 10, while the occurrence of a hard overload signal OCHI or a severe overload signal asserts a signal on a line 82 to trigger a rapid turn off of the power switch 10. A further distinction may be made if desired, as in patent application PCT/EP2004/014895, between a hard overload, where repeated attempts to turn the switch on again may be made and a severe overload where the power switch 10 is turned off definitively and no attempt is made to turn the switch on again.

The invention claimed is:

1. Power supply switching apparatus comprising:
an output switch for supplying power from a power supply to a load connected to an output terminal;
a driver for controlling turn-on of said output switch; and
a control signal generator for controlling said driver to produce a desired progressive turn-on characteristic, said control signal generator including an overload detection circuit responsive to a parameter of the load relative to a reference signal to provide a first fault signal in case of detection of an overload condition after a turn-on phase of said output switch, wherein said control signal generator is responsive to said reference signal to activate said overload detection circuit to respond to an overload condition at said load and provide a second fault signal at least during said turn-on phase of said output switch even in presence of a severe overload condition at the output terminal, wherein said overload detection circuit comprises a first detector activated at a first voltage for detecting resistive overload and a second detector activated at a second voltage different from said first voltage for detecting the severe overload.

2. Power supply switching apparatus as claimed in claim 1, wherein said overload detection circuit is responsive to a parameter relating to a current in said load at least after said turn-on phase.

3. Power supply switching apparatus as claimed in claim 1, wherein said driver is arranged to turn on supply of power to said overload detection circuit when starting said turn on phase.

4. Power supply switching apparatus as claimed in claim 3, wherein said reference signal is arranged to be supplied to power said overload detection circuit, and said driver is arranged to turn on said reference signal when starting said turn on phase.

5. Power supply switching apparatus as claimed in claim 1, and including fault management circuit responsive to said overload detection circuit for turning said output switch off, said fault management circuit being arranged to respond more rapidly to a fault signal in case of detection of an overload condition during said turn-on phase than to a fault signal in case of detection of an overload condition after said turn-on phase.

6. Power supply switching apparatus comprising:
an output switch for supplying power from a power supply to a load connected to an output terminal;
a driver for controlling turn-on of said output switch;
a control signal generator for controlling said driver to produce a desired progressive turn-on characteristic, said control signal generator including an overload detection circuit responsive to a parameter of the load relative to a reference signal to provide a first fault signal in case of detection of an overload condition after a turn-on phase of said output switch, wherein said control signal generator is responsive to said reference signal to activate said overload detection circuit to respond to an overload condition at said load and provide a second fault signal at least during said turn-on phase of said output switch even in presence of a severe overload condition at the output terminal; and
a fault management circuit responsive to said overload detection circuit for turning said output switch off, said fault management circuit being arranged to respond more rapidly to a fault signal in case of detection of an overload condition during said turn-on phase than to a fault signal in case of detection of an overload condition after said turn-on phase.

7. Power supply switching apparatus as claimed in claim 6, wherein said control signal generator is responsive to a parameter of power supply to said load as well as to said reference signal at least during said turn-on phase so as to activate said overload detection circuit to respond to an overload condition.

8. Power supply switching apparatus as claimed in claim 7, wherein said parameter of power supply to said load to which said control signal generator and said overload detection circuit are responsive during said turn-on phase comprises a voltage applied to said output terminal.

9. Power supply switching apparatus as claimed in claim 8, wherein said overload detection circuit comprises a detector responsive to a parameter related to a severe overload on said output terminal during said turn-on phase and related to an impedance at said load relative to a reference impedance.

10. Power supply switching apparatus as claimed in claim 6, wherein said overload detection circuit is responsive to a parameter relating to a current in said load at least after said turn-on phase.

11. Power supply switching apparatus as claimed in claim 6, wherein said overload detection circuit comprises a reference signal generator for generating said reference signal, said output switch and said reference signal generator comprising respectively an output switch transistor and a reference signal generator transistor having control electrodes, and said driver is arranged to supply a controlled turn-on signal to said control electrodes of both said output switch transistor and said reference signal generator transistor.

12. Power supply switching apparatus as claimed in claim 6, wherein said driver is arranged to turn on supply of power to said overload detection circuit when starting said turn on phase.

13. Power supply switching apparatus as claimed in claim 12, wherein said reference signal is arranged to be supplied to power said overload detection circuit, and said driver is arranged to turn on said reference signal when starting said turn on phase.

14. A method for providing overload detection in a power supply switching apparatus, the method comprising:
supplying, at an output switch, power from a power supply to a load connected to an output terminal;
controlling, at a driver, turn-on of said output switch; and
controlling the driver to produce a desired progressive turn-on characteristic of the output switch;
during a turn-on phase of the output switch:
activating an overload detection circuit in response to a reference signal;
responding, at the overload detection circuit, to a first overload condition at the load; and
providing a first fault signal in response to a severe overload condition at the output terminal; and
after the turn-on phase of the output switch:
monitoring a parameter of the load relative to the reference signal; and
providing a second fault signal in response to a detection of a second overload condition based on the parameter of the load relative to the reference signal.

15. The method claim 14, further comprising:
responding to a parameter related to the severe overload on the output terminal during the turn-on phase and related to an impedance at the load relative to a reference impedance.

16. The method of claim 15, wherein the parameter of power supply to the load to which the control signal generator and the overload detection circuit are responsive during the turn-on phase comprises a voltage applied to said output terminal.

17. The method of claim 16, further comprising:
responding to a parameter related to a severe overload on said output terminal during said turn-on phase and related to an impedance at said load relative to a reference impedance.

18. The method of claim 14, further comprising:
responding to a parameter relating to a current in said load at least after said turn-on phase.

19. Power supply switching apparatus comprising:
an output switch for supplying power from a power supply to a load connected to an output terminal;
a driver for controlling turn-on of said output switch; and
a control signal generator for controlling said driver to produce a desired progressive turn-on characteristic, said control signal generator including an overload detection circuit responsive to a parameter of the load relative to a reference signal to provide a first fault signal in case of detection of an overload condition after a turn-on phase of said output switch, wherein said control signal generator is responsive to said reference signal to activate said overload detection circuit to respond to an overload condition at said load and provide a second fault signal at least during said turn-on phase of said output switch even in presence of a severe overload condition at the output terminal,
wherein said control signal generator is responsive to a parameter of power supply to said load as well as to said reference signal at least during said turn-on phase so as to activate said overload detection circuit to respond to an overload condition, wherein said parameter of power supply to said load to which said control signal generator and said overload detection circuit are responsive during said turn-on phase comprises a voltage applied to said output terminal, and wherein said overload detection circuit comprises a detector responsive to a parameter related to a severe overload on said output terminal during said turn-on phase and related to an impedance at said load relative to a reference impedance.

20. Power supply switching apparatus comprising:
an output switch for supplying power from a power supply to a load connected to an output terminal;
a driver for controlling turn-on of said output switch; and
a control signal generator for controlling said driver to produce a desired progressive turn-on characteristic, said control signal generator including an overload detection circuit responsive to a parameter of the load relative to a reference signal to provide a first fault signal in case of detection of an overload condition after a turn-on phase of said output switch, wherein said control signal generator is responsive to said reference signal to activate said overload detection circuit to respond to an overload condition at said load and provide a second fault signal at least during said turn-on phase of said output switch even in presence of a severe overload condition at the output terminal, wherein said overload detection circuit comprises a reference signal generator for generating said reference signal, said output switch and said reference signal generator comprising respectively an output switch transistor and a reference signal generator transistor having control electrodes, and said driver is arranged to supply a controlled turn-on signal to said control electrodes of both said output switch transistor and said reference signal generator transistor.

* * * * *